(12) United States Patent
Nikitin et al.

(10) Patent No.: US 8,304,884 B2
(45) Date of Patent: Nov. 6, 2012

(54) SEMICONDUCTOR DEVICE INCLUDING SPACER ELEMENT

(75) Inventors: Ivan Nikitin, Regensburg (DE); Joachim Mahler, Regensburg (DE); Thomas Behrens, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/401,773

(22) Filed: Mar. 11, 2009

(65) Prior Publication Data

US 2010/0230798 A1 Sep. 16, 2010

(51) Int. Cl.
*H01L 23/48* (2006.01)
*H01L 23/52* (2006.01)

(52) U.S. Cl. ........ 257/690; 438/107; 438/610; 257/741; 257/E23.06; 257/E21.499

(58) Field of Classification Search .......... 257/685–686, 257/777, 782, 783; 438/610; 977/777; 427/126.5
See application file for complete search history.

(56) References Cited

U.S. PATENT DOCUMENTS

| 5,422,435 A | * | 6/1995 | Takiar et al. ................. 174/521 |
| 5,744,848 A | * | 4/1998 | Harazono ..................... 257/433 |
| 7,042,085 B2 | * | 5/2006 | Wolf et al. .................... 257/724 |
| 7,880,285 B2 | | 2/2011 | Hosseini et al. |
| 2007/0040260 A1 | * | 2/2007 | Otremba ....................... 257/686 |
| 2008/0160183 A1 | * | 7/2008 | Ide et al. .................... 427/126.5 |
| 2009/0134206 A1 | | 5/2009 | Schmitt et al. |

FOREIGN PATENT DOCUMENTS

| DE | 10 2007 018 914 | | 10/2008 |
| DE | 10 2009 010 214 | | 9/2010 |
| EP | 2 019 429 | | 1/2009 |
| EP | 2 042 260 | | 4/2009 |
| JP | 2006228804 A | * | 8/2006 |
| JP | 2006 352 080 | | 12/2006 |

* cited by examiner

*Primary Examiner* — Michelle Mandala
*Assistant Examiner* — Shaka White
(74) *Attorney, Agent, or Firm* — Dicke, Billig & Czaja, PLLC

(57) ABSTRACT

A semiconductor device includes a metal carrier and a spacer element attached to the metal carrier. The semiconductor device includes a first sintered metal layer on the spacer element and a semiconductor chip on the first sintered metal layer.

23 Claims, 4 Drawing Sheets

SEMICONDUCTOR DEVICE INCLUDING SPACER ELEMENT

BACKGROUND

One type of semiconductor device includes one or more semiconductor chips or die attached to a metal carrier, such as a leadframe. In one typical embodiment, a semiconductor chip is attached to a metal carrier using an insulating dielectric glue that electrically isolates the semiconductor chip from the metal carrier. The insulating glue is typically not robust against mechanical stress. In addition, the insulating glue is also subject to moisture absorption, which deteriorates the dielectric properties of the insulating glue.

In another typical embodiment, a direct copper bonding (DCB) substrate is used to attach a semiconductor chip to a metal carrier. The DCB substrate includes a ceramic material, such $Al_2O_3$, AlN, $Si_3N_4$, or other suitable material, and a Cu plate on both a first main face of the ceramic material and on a second main face of the ceramic material opposite the first main face. One of the Cu plates is attached to the metal carrier and the other one of the Cu plates is attached to the semiconductor chip. The ceramic material electrically isolates the metal carrier from the semiconductor chip. Using DCB substrates to attach a semiconductor chip to a metal carrier, however, is expensive.

In another typical embodiment, semiconductor chips having different heights (e.g., a power semiconductor chip and a logic semiconductor chip) are attached to the same metal carrier. A bond wire is used to electrically couple the two semiconductor chips. The bond wire typically has high parasitic capacitances since the bond wire is relatively long due to the difference in height between the two semiconductor chips.

For these and other reasons, there is a need for the present invention.

SUMMARY

One embodiment provides a semiconductor device. The semiconductor device includes a metal carrier and a spacer element attached to the metal carrier. The semiconductor device includes a first sintered metal layer on the spacer element and a semiconductor chip on the first sintered metal layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
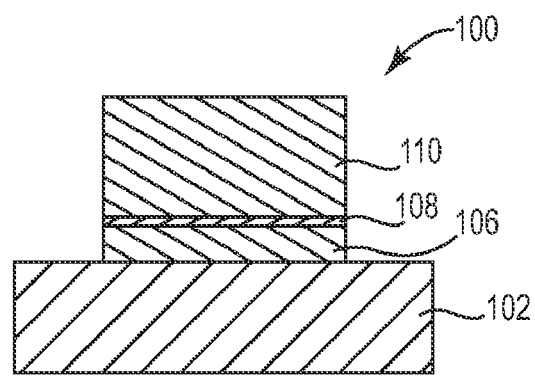
FIG. 1 illustrates a cross-sectional view of one embodiment of a semiconductor device.

FIG. 1 illustrates a cross-sectional view of one embodiment of a semiconductor device 100. Semiconductor device 100 includes a metal carrier 102, a spacer element 106, a sintered metal layer 108, and a semiconductor chip 110. Metal carrier 102 includes a leadframe, a metal layer, a die pad, or another suitable metal carrier. In one embodiment, metal carrier 102 has a thickness within a range between approximately 125 μm and 200 μm. The top of metal carrier 102 contacts the bottom of spacer element 106.

In one embodiment, spacer element 106 includes a dielectric or electrically insulating material, such as a ceramic material, a semiconductor material, a polymer material, or another suitable dielectric material. In another embodiment, spacer element 106 includes an electrically conductive material, such as a metal, a doped semiconductor material, or another suitable electrically conductive material. In one embodiment, spacer element 106 has a thickness within a range between approximately 10 μm and 300 μm. The top of spacer element 106 contacts the bottom of sintered metal layer 108.

Sintered metal layer 108 includes sintered nanometer-sized metal particles. The metal particles include one or more of Au, Ag, Cu, or other suitable metals. In one embodiment, the size of the metal particles is within a range between approximately 10 nm and 100 nm. The top of sintered metal layer 108 contacts the bottom of semiconductor chip 110. Sintered metal layer 108 joins semiconductor chip 110 to spacer element 106.

In one embodiment, semiconductor chip 110 is electrically isolated from metal carrier 102 via a dielectric spacer element 106. In one embodiment, semiconductor chip 110 is thermally coupled to metal carrier 102 via dielectric spacer element 106 such that metal carrier 102 acts as a heat sink for semiconductor chip 110. In another embodiment, semiconductor chip 110 is electrically coupled to metal carrier 102 via sintered metal layer 108 and an electrically conducting spacer element 106.

Spacer element 106 of semiconductor device 100 provides increased robustness against mechanical stress compared to semiconductor devices that include an insulating dielectric glue for attaching a semiconductor chip to a metal carrier. In addition, spacer element 106 reduces the cost of semiconductor device 100 compared to semiconductor devices that include a direct copper bonding (DCB) substrate for attaching a semiconductor chip to a metal carrier.

Figure 2:
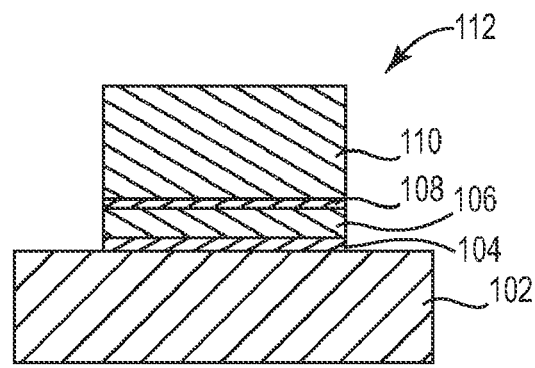
FIG. 2 illustrates a cross-sectional view of another embodiment of a semiconductor device.

FIG. 2 illustrates a cross-sectional view of another embodiment of a semiconductor device 112. Semiconductor device 112 is similar to semiconductor device 100 previously described and illustrated with reference to FIG. 1, except that semiconductor device 112 includes sintered metal layer 104. In this embodiment, the top of metal carrier 102 contacts the bottom of sintered metal layer 104.

Sintered metal layer 104 includes sintered nanometer-sized metal particles. The metal particles include one or more of Au, Ag, Cu, or other suitable metals. In one embodiment, the size of the metal particles is within a range between approximately 10 nm and 100 nm. The top of sintered metal layer 104 contacts the bottom of spacer element 106. Sintered metal layer 104 joins spacer element 106 to metal carrier 102.

Figure 3:
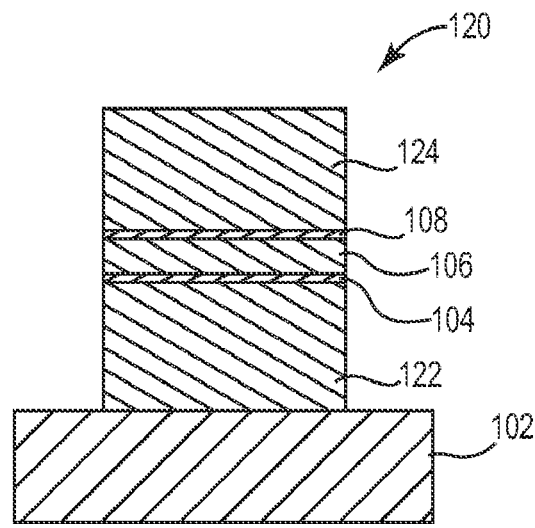
FIG. 3 illustrates a cross-sectional view of another embodiment of a semiconductor device.

FIG. 3 illustrates a cross-sectional view of another embodiment of a semiconductor device 120. Semiconductor device 120 includes a metal carrier 102, a first semiconductor chip 122, a first sintered metal layer 104, a spacer element 106, a second sintered metal layer 108, and a second semiconductor chip 124. The top of metal carrier 102 contacts the bottom of first semiconductor chip 122. In one embodiment, metal carrier 102 is attached to first semiconductor chip 122 via a sintered metal layer (not shown). In other embodiments, metal carrier 102 is attached to first semiconductor chip 122 via another suitable method. The top of semiconductor chip 122 contacts the bottom of first sintered metal layer 104.

The top of first sintered metal layer 104 contacts the bottom of spacer element 106. First sintered metal layer 104 joins spacer element 106 to first semiconductor chip 122. The top of spacer element 106 contacts the bottom of second sintered metal layer 108. The top of second sintered metal layer 108 contacts the bottom of second semiconductor chip 124. Second sintered metal layer 108 joins second semiconductor chip 124 to spacer element 106.

In one embodiment, spacer element 106 includes a dielectric material for electrically isolating first semiconductor chip 122 from second semiconductor chip 124. In other embodiments, additional spacer elements and associated sintered metal layers and semiconductor chips are provided over second semiconductor chip 124 to provide a semiconductor device including any suitable number of stacked semiconductor chips.

Figure 4:
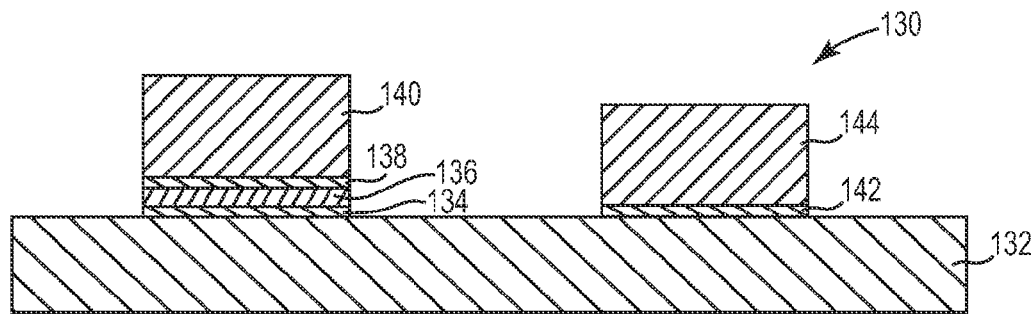
FIG. 4 illustrates a cross-sectional view of another embodiment of a semiconductor device.

FIG. 4 illustrates a cross-sectional view of another embodiment of a semiconductor device 130. Semiconductor device 130 includes a metal carrier 132, a first sintered metal layer 134, a spacer element 136, a second sintered metal layer 138, a first semiconductor chip 140, a third sintered metal layer 142, and a second semiconductor chip 144. Metal carrier 132 includes a leadframe, a metal layer, a die pad, or another suitable metal carrier. The top of metal carrier 132 contacts the bottom of first sintered metal layer 134 and the bottom of third sintered metal layer 142.

The top of first sintered metal layer 134 contacts the bottom of spacer element 136. First sintered metal layer 134 joins spacer element 136 to metal carrier 132. The top of spacer element 136 contacts the bottom of second sintered metal layer 138. The top of second sintered metal layer 138 contacts the bottom of first semiconductor chip 140. Second sintered metal layer 138 joins first semiconductor chip 140 to spacer element 136. The top of third sintered metal layer 142 contacts the bottom of second semiconductor chip 144. Third sintered metal layer 142 joins second semiconductor chip 144 to metal carrier 132.

In one embodiment, first semiconductor chip 140 is electrically isolated from metal carrier 132 via a dielectric spacer element 136. In one embodiment, first semiconductor chip 140 is thermally coupled to metal carrier 132 via spacer element 136 such that metal carrier 132 acts as a heat sink for semiconductor chip 140. In one embodiment, second semiconductor chip 144 is electrically coupled to metal carrier 132 via third sintered metal layer 142.

Figure 5:
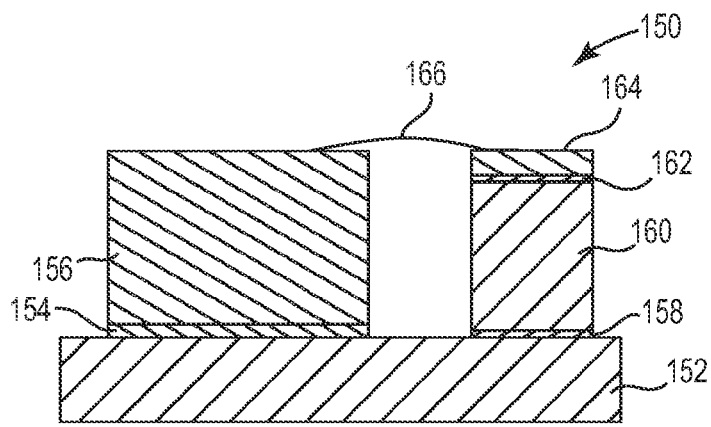
FIG. 5 illustrates a cross-sectional view of another embodiment of a semiconductor device.

FIG. 5 illustrates a cross-sectional view of another embodiment of a semiconductor device 150. Semiconductor device 150 includes a metal carrier 152, a dielectric layer 154, a first semiconductor chip 156, a first sintered metal layer 158, a spacer element 160, a second sintered metal layer 162, and a second semiconductor chip 164. Metal carrier 152 includes a leadframe, a metal layer, a die pad, or another suitable metal carrier.

The top of metal carrier 152 contacts the bottom of dielectric layer 154 and the bottom of first sintered metal layer 158. The top of dielectric layer 154 contacts the bottom of first semiconductor chip 156. Dielectric layer 154 joins first semiconductor chip 156 to metal carrier 152. Dielectric layer 154 also electrically isolates first semiconductor chip 156 from metal carrier 152.

The top of first sintered metal layer 158 contacts the bottom of spacer element 160. First sintered metal layer 158 joins spacer element 160 to metal carrier 152. The top of spacer element 160 contacts the bottom of second sintered metal layer 162. The top of second sintered metal layer 162 contacts the bottom of second semiconductor chip 164. Second sintered metal layer 162 joins second semiconductor chip 164 to spacer element 160. In one embodiment, spacer element 160 includes an electrically conductive material, such as a metal or doped semiconductor material, to electrically couple second semiconductor chip 164 to metal carrier 152.

The thickness of spacer element 160 is selected such that the top of first semiconductor chip 156 is coplanar with the top of second semiconductor chip 164. In one embodiment, first semiconductor chip 156 is a logic semiconductor chip and second semiconductor chip 164 is a power semiconductor chip. In one embodiment, logic semiconductor chip 156 has a thickness greater than approximately 200 μm and power semiconductor chip 164 has a thickness between approximately 60 μm and 170 μm. Therefore in this embodiment, spacer element 160 is sized to make up the difference in thickness between logic semiconductor chip 156 and power semiconductor chip 164 (i.e., spacer element 160 has a thickness of at least approximately 30 μm).

First semiconductor chip 156 is electrically coupled to second semiconductor chip 164 through a bond wire 166. Bond wire 166 includes Al, Cu, Al—Mg, Au, or another suitable material. In one embodiment, bond wire 166 is bonded to first semiconductor chip 156 and second semiconductor chip 164 using ultrasonic wire bonding. By using spacer element 160 such that the top of first semiconductor chip 156 is coplanar with the top of second semiconductor device 164, the length of bond wire 166 is reduced compared to semiconductor devices that do not include a spacer element 160. By reducing the length of bond wire 166, the parasitic capacitances of bond wire 166 are also reduced.

Figure 6:
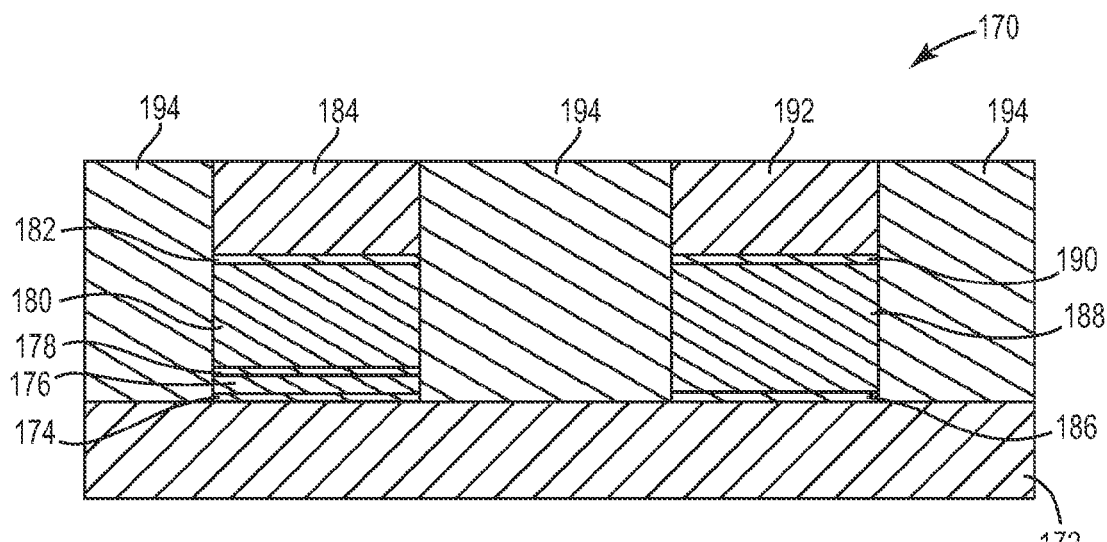
FIG. 6 illustrates a cross-sectional view of another embodiment of a semiconductor device.

FIG. 6 illustrates a cross-sectional view of another embodiment of a semiconductor device 170. Semiconductor device 170 includes a first metal carrier 172, a first sintered metal layer 174, a spacer element 176, a second sintered metal layer 178, a first semiconductor chip 180, a third sintered metal layer 182, a second metal carrier 184, a fourth sintered metal layer 186, a second semiconductor chip 188, a fifth sintered metal layer 190, a third metal carrier 192, and mold compound 194.

Metal carrier 172 includes a leadframe, a metal layer, a die pad, or another suitable metal carrier. The top of metal carrier 172 contacts the bottom of first sintered metal layer 174 and the bottom of fourth sintered metal layer 186. The top of first sintered metal layer 174 contacts the bottom of spacer element 176. First sintered metal layer 174 joins spacer element 176 to metal carrier 172. The top of spacer element 176 contacts the bottom of second sintered metal layer 178. The top of second sintered metal layer 178 contacts the bottom of first semiconductor chip 180. Second sintered metal layer 178 joins first semiconductor chip 180 to spacer element 176. The top of first semiconductor chip 180 contacts the bottom of third sintered metal layer 182. The top of third sintered metal layer 182 contacts the bottom of second metal carrier 184. Third sintered metal layer 182 joins metal carrier 184 to first semiconductor chip 180. Second metal carrier 184 includes a leadframe, a metal layer, or another suitable metal carrier.

The top of fourth sintered metal layer 186 contacts the bottom of second semiconductor chip 188. Fourth sintered metal layer 186 joins second semiconductor chip 188 to metal carrier 172. The top of second semiconductor chip 188 contacts the bottom of fifth sintered metal layer 190. The top of fifth sintered metal layer 190 contacts the bottom of third metal carrier 192. Fifth sintered metal layer 190 joins metal carrier 192 to second semiconductor chip 188. Third metal carrier 192 includes a leadframe, a metal layer, or another suitable metal carrier. Mold compound 194 laterally surrounds first sintered metal layer 174, spacer element 176, second sintered metal layer 178, first semiconductor chip 180, third sintered metal layer 182, second metal carrier 184, fourth sintered metal layer 186, second semiconductor chip 188, fifth sintered metal layer 190, and third metal carrier 192.

In one embodiment, spacer element 176 includes a dielectric material to electrically isolate first semiconductor chip 180 from metal carrier 172. In another embodiment, spacer element 176 includes an electrically conductive material to electrically couple first semiconductor chip 180 to metal carrier 172. In one embodiment, the thickness of spacer element 176 is selected such that the top of first semiconductor chip 180 is coplanar with the top of second semiconductor chip 188. By selecting spacer element 176 such that the top of first semiconductor chip 180 is coplanar with the top of second semiconductor chip 188, second metal carrier 184 and third metal carrier 192 as well as mold compound 194 can be applied to provide a double sided semiconductor device.

The following FIGS. 7-14 illustrate embodiments for fabricating spacer elements and semiconductor devices incorporating spacer elements, such as semiconductor devices 100, 112, 120, 130, 150, and 170 previously described and illustrated with reference to FIGS. 1-6, respectively.

Figure 7:
FIG. 7 illustrates a cross-sectional view of one embodiment of a sheet of material.

FIG. 7 illustrates a cross-sectional view of one embodiment of a sheet of material 200a. In one embodiment, sheet of material 200a is a dielectric material, such as a ceramic material, a semiconductor material, a polymer material, or another suitable dielectric material. In one embodiment, sheet of material 200a is undoped silicon. In another embodiment, sheet of material 200a is an electrically conductive material, such as a metal, a doped semiconductor material, or another suitable electrically conductive material. In one embodiment, sheet of material 200a is doped silicon.

Figure 8:
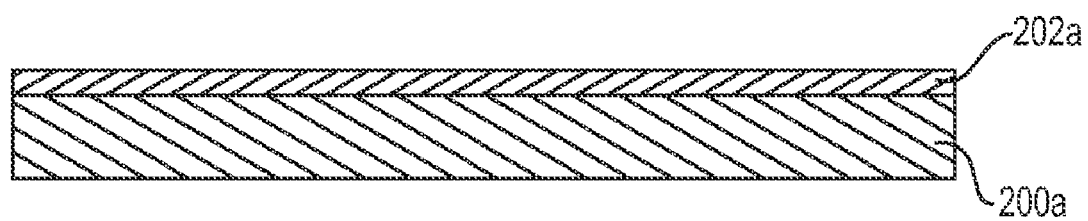
FIG. 8 illustrates a cross-sectional view of one embodiment of the sheet of material and a layer of dried nanopaste.

FIG. 8 illustrates a cross-sectional view of one embodiment of sheet of material 200a and a layer of dried nanopaste 202a. A liquid or paste including nanometer-sized metal particles is applied over a first main face of sheet of material 200a. The metal paste is applied to sheet of material 200a by printing, dispensing, or other suitable method. The metal particles include one or more of Au, Ag, Cu, or other suitable metals. In one embodiment, the metal paste includes metal particles having a particle size distribution where at least 50% of the particles are smaller than 50 nm. In another embodiment, the metal paste includes metal particles having a particle size distribution where at least 95% of the particles are smaller than 50 nm. In another embodiment, the metal paste includes metal particles having a particle size with a range between approximately 10 nm and 100 nm.

The metal paste also includes one or more solvents to control the viscosity of the metal paste and a sintering inhibiter to prevent the metal particles from sintering at low temperatures. In one embodiment, the solvents of the metal paste are selected to decompose at a temperature ($T_{solvent}$) within a range between approximately 25° C. and 200° C. The solvents of the metal paste are also selected such that the solvents dry out in response to temperature and/or a vacuum without degrading the sintering inhibitor. In one embodiment, the sintering inhibitor includes a technical wax or another suitable material. In one embodiment, the sintering inhibitor of the metal paste is selected to decompose at a temperature ($T_{inhibitor}$) within a range between approximately 150° C. and 400° C. The sintering inhibitor is selected to decompose at a higher temperature than the solvents. By maximizing the temperature difference between $T_{solvent}$ and $T_{inhibitor}$, the process window is maximized.

In one embodiment, the metal paste is dried at a temperature within a range between approximately 25° C. and 200° C. and/or by a vacuum to provide dried metal nanopaste 202a. The temperature and/or vacuum are selected based on the solvents used to ensure an evaporation of the solvents. The temperature is selected such that a sintering of the metal particles during the evaporation of the solvents is prevented by the sintering inhibitor.

Figure 9:
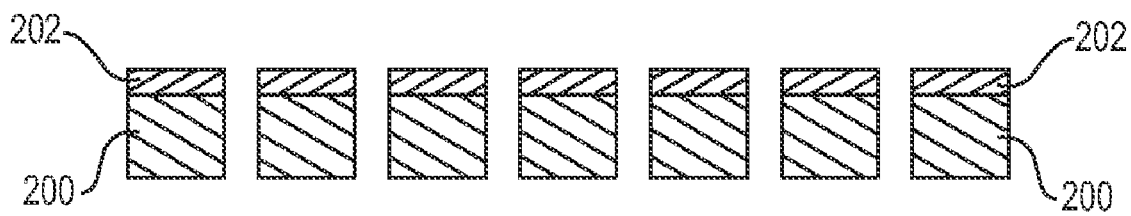
FIG. 9 illustrates a cross-sectional view of one embodiment of a plurality of spacer elements.

FIG. 9 illustrates a cross-sectional view of one embodiment of a plurality of spacer elements 200. Sheet of material 200a and layer of dried nanopaste 202a are diced to provide a plurality of spacer elements 200. A layer of dried nanopaste 202 covers a first main face of each spacer element 200. Sheet of material 200a and layer of dried nanopaste 202a are diced using mechanical dicing, laser dicing, stealth dicing, water jet dicing, wet or dry etching, combinations thereof, or other suitable singulation technique.

Figure 10:
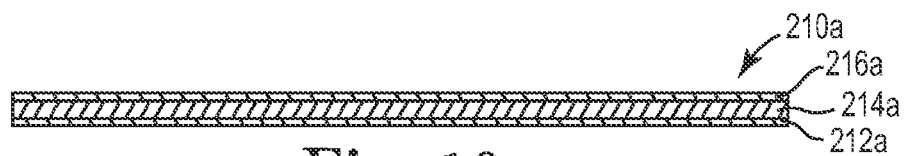
FIG. 10 illustrates a cross-sectional view of one embodiment of a metallized substrate.

FIG. 10 illustrates a cross-sectional view of one embodiment of a metallized substrate 210a. Metallized substrate 210a includes a substrate 214a, first metallization 212a, and second metallization 216a. First metallization 212a is on a first main face of substrate 214a and second metallization 216a is on a second main face of substrate 214a opposite the first main face. In one embodiment, first metallization 212a and second metallization 216a are excluded and substrate 214a is used by itself in the process described below with reference to the following FIGS. 11-14.

In one embodiment, substrate 214a is a dielectric material, such as a ceramic material, a semiconductor material, a polymer material, or another suitable dielectric material. In one embodiment, substrate 214a is an undoped silicon wafer. In another embodiment, substrate 214a is an electrically conductive material, such as a metal, a doped semiconductor material, or another suitable electrically conductive material. In one embodiment, substrate 214a is a doped silicon wafer.

In one embodiment, the bottom side of substrate 214a is metallized with either pure or plated Cu, Al, or other suitable material to provide first metallization 212a. First metallization 212a provides electrical and/or mechanical contacts for semiconductor chips and/or metal carriers. In one embodiment, the top side of substrate 214a is also metallized with either pure or plated Cu, Al, or other suitable material to provide second metallization 216a. Second metallization 216a provides electrical and/or mechanical contacts for semiconductor chips and/or metal carriers. In one embodiment, metal layers 212a and 216a are bonded to substrate 214a using a direct copper bonding (DCB) process, a direct aluminum bonding process (DAB) process, an active metal brazing (AMB) process, or another suitable process.

Figure 11:
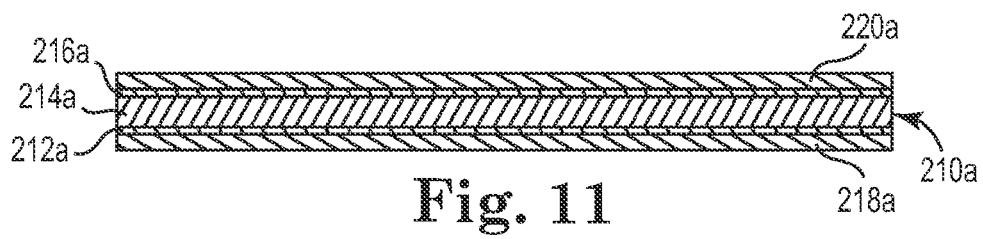
FIG. 11 illustrates a cross-sectional view of one embodiment of the metallized substrate, a first layer of dried nanopaste, and a second layer of dried nanopaste.

FIG. 11 illustrates a cross-sectional view of one embodiment of metallized substrate 210a, a first layer of dried nanopaste 218a, and a second layer of dried nanopaste 220a. A liquid or paste including nanometer-sized metal particles as previously described with reference to FIG. 8 is applied over the bottom or first main face of metallized substrate 210a. The paste is also applied over the top or second main face of metallized substrate 210a. The metal paste is then dried at a temperature within a range between approximately 25° C. and 200° C. and/or by a vacuum to provide first layer of dried metal nanopaste 218a and second layer of dried metal nanopaste 220a.

Figure 12:
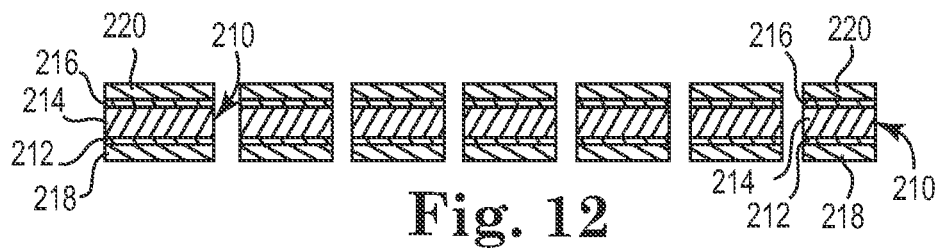
FIG. 12 illustrates a cross-sectional view of one embodiment of a plurality of spacer elements.

FIG. 12 illustrates a cross-sectional view of one embodiment of a plurality of spacer elements 210. Metallized substrate 210a, first layer of dried nanopaste 218a, and second layer of dried nanopaste 220a are diced to provide a plurality of spacer elements 210. A first layer of dried nanopaste 218 covers first metallization 212 of each spacer element 210 and a second layer of dried nanopaste 220 covers second metallization 216 of each spacer element 210. Metallized substrate 210a, first layer of dried nanopaste 218a, and second layer of dried nanopaste 220a are diced using mechanical dicing, laser dicing, stealth dicing, water jet dicing, wet or dry etching, combinations thereof, or other suitable singulation technique.

Figure 13:
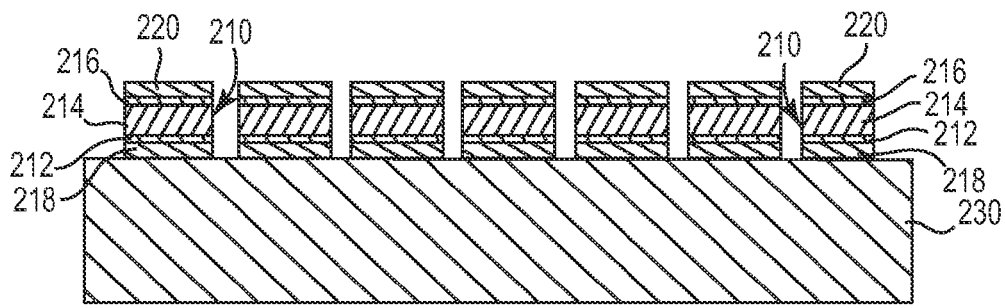
FIG. 13 illustrates a cross-sectional view of one embodiment of a plurality of spacer elements and a metal carrier.

FIG. 13 illustrates a cross-sectional view of one embodiment of a plurality of spacer elements 210 and a metal carrier 230. Each of a plurality of spacer elements 210 is placed onto metal carrier 230 such that first layer of dried nanopaste 218 contacts metal carrier 230. In one embodiment, each spacer element 210 is placed onto metal carrier 230 using a pick-and-place method or another suitable process. Metal carrier 230 includes a leadframe, a metal layer, or another suitable metal carrier.

Figure 14:
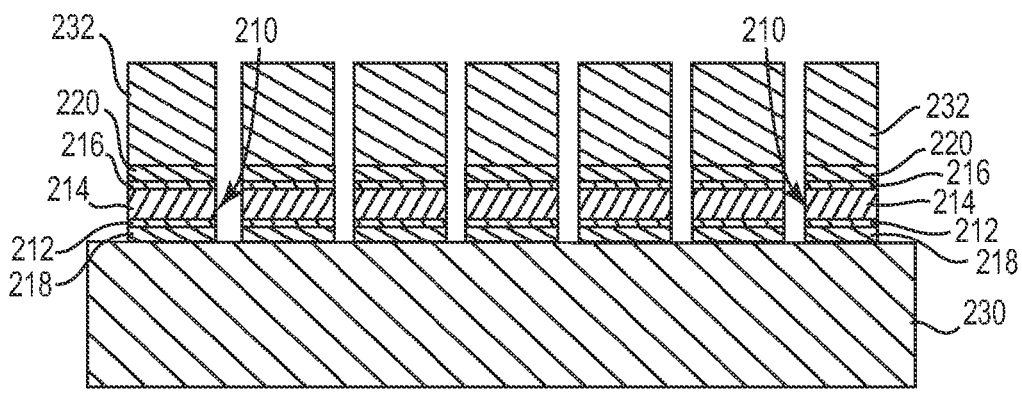
FIG. 14 illustrates a cross-sectional view of one embodiment of the plurality of spacer elements, the metal carrier, and a plurality of semiconductor chips.

FIG. 14 illustrates a cross-sectional view of one embodiment of the plurality of spacer elements 210, metal carrier 230, and a plurality of semiconductor chips 232. A semiconductor chip 232 is placed over each spacer element 210 such that each semiconductor chip 232 contacts a second layer of dried nanopaste 220. Each semiconductor chip 232 is placed onto a second layer of dried nanopaste 220 using a pick-and-place method or another suitable process.

Metal carrier 230, spacer elements 210, and semiconductor chips 232 are heated to a temperature within a range between approximately 200° C. and 300° C. At the same time, a bond force is applied to each semiconductor chip 232 to bond each semiconductor chip 232 to a spacer element 210 and to bond each spacer element 210 to metal carrier 230. In one embodiment, the bond force is within a range between approximately 1 MPa and 40 MPa. In another embodiment, the bond force is within a range between approximately 1 MPa and 10 MPa. In one embodiment, the bond force is applied for a time within a range between approximately 50 ms and 6000 ms. The bond force provides a good coalescence of the metal particles within each first dried nanopaste layer 218 and second dried nanopaste layer 220 to semiconductor chip 232, spacer element 210, and metal carrier 230.

The sintering inhibitor within each first dried nanopaste layer 218 quickly decomposes to form a sintered metal layer between each spacer element 210 and metal carrier 230 bonding each spacer element 210 to metal carrier 230. The sintering inhibitor within each second dried nanopaste layer 220 quickly decomposes to form a sintered metal layer between each spacer element 210 and semiconductor chip 232 bonding each semiconductor chip 232 to the spacer element 210.

After sintering, metal carrier 230 is diced to provide a plurality of semiconductor devices, such as semiconductor device 112 previously described and illustrated with reference to FIG. 2. In other embodiments, a process similar to the process previously described and illustrated with reference to FIGS. 10-14 is performed to provide other suitable semiconductor devices including spacer elements and sintered metal layers.

Embodiments provide semiconductor devices including at least one spacer element. The spacer element is joined to a metal carrier and/or a semiconductor chip via at least one sintered metal layer. The spacer element includes either a dielectric material or an electrically conductive material. Embodiments of the semiconductor devices including the spacer element are less expensive to fabricate than typical semiconductor devices including DCB substrates. In addition, embodiments of the semiconductor devices including the spacer element to couple a semiconductor chip to a metal carrier are more robust against mechanical stress and provide improved thermal characteristics compared to semiconductor devices that use an insulating glue to couple a semiconductor chip to a metal carrier.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device comprising:
a metal carrier;
a spacer element directly attached to the metal carrier, the spacer element consisting of one of an electrically insulating material and an electrically conductive material;
a first sintered metal layer directly contacting the spacer element, the first sintered metal layer comprising sintered nanometer-sized metal particles; and
a semiconductor chip directly contacting the first sintered metal layer.

2. The semiconductor device of claim 1, wherein the electrically insulating material comprises one of a semiconductor material and a polymer material.

3. The semiconductor device of claim 1, wherein the electrically insulating material comprises a ceramic material.

4. The semiconductor device of claim 1, wherein the electrically insulating material comprises a thermally conductive material.

5. The semiconductor device of claim 1, wherein the electrically conductive material comprises a doped semiconductor material.

6. The semiconductor device of claim 1, wherein the electrically conductive material comprises a metal.

7. The semiconductor device of claim 1, wherein the metal carrier comprises one of a leadframe, a metal layer, and a die pad.

8. A semiconductor device comprising:
a first metal carrier;
a spacer element consisting of one of an electrically insulating material and an electrically conductive material;
a first semiconductor chip;
a first sintered metal layer attaching the spacer element to the first metal carrier such that the first sintered metal layer directly contacts the spacer element and the first metal carrier, the first sintered metal layer comprising sintered nanometer-sized metal particles; and
a second sintered metal layer attaching the first semiconductor chip to the spacer element such that the second sintered metal layer directly contacts the first semiconductor chip and the spacer element, the second sintered metal layer comprising sintered nanometer-sized metal particles.

9. The semiconductor device of claim 8, further comprising:
a second semiconductor chip; and
a third sintered metal layer attaching the second semiconductor chip to the first metal carrier such that the third sintered metal layer directly contacts the second semiconductor chip and the first metal carrier.

10. The semiconductor device of claim 9, wherein a top of the first semiconductor chip is coplanar with a top of the second semiconductor chip.

11. A semiconductor device comprising:
a first metal carrier;
a spacer element;
a first semiconductor chip;
a first sintered metal layer attaching the spacer element to the first metal carrier;
a second sintered metal layer attaching the first semiconductor chip to the spacer element;
a second semiconductor chip;
a third sintered metal layer attaching the second semiconductor chip to the first metal carrier;
a second metal carrier;
a fourth sintered metal layer attaching the second metal carrier to the first semiconductor chip;
a third metal carrier; and
a fifth sintered metal layer attaching the third metal carrier to the second semiconductor chip,
wherein a top of the first semiconductor chip is coplanar with a top of the second semiconductor chip.

12. The semiconductor device of claim 9, wherein the first semiconductor chip comprises a power semiconductor chip, and
wherein the second semiconductor chip comprises a logic semiconductor chip.

13. The semiconductor device of claim 9, further comprising:
a bond wire bond electrically coupling the first semiconductor chip to the second semiconductor chip.

14. The semiconductor device of claim 8, wherein the electrically conductive material comprises a doped semiconductor material.

15. The semiconductor device of claim 8, wherein the electrically insulating material comprises one of semiconductor material and a polymer material.

16. The semiconductor device of claim 11, further comprising:
a mold compound laterally surrounding the spacer element, the first semiconductor chip, the first sintered metal layer, the second sintered metal layer, the second semiconductor chip, the third sintered metal layer, the second metal carrier, the fourth sintered metal layer, the third metal carrier, and the fifth sintered metal layer.

17. A semiconductor device comprising:
a metal carrier;
a first semiconductor chip attached to the metal carrier;
a spacer element;
a first sintered metal layer attaching the spacer element to the first semiconductor chip, the first sintered metal layer comprising sintered nanometer-sized metal particles;
a second semiconductor chip; and
a second sintered metal layer attaching the second semiconductor chip to the spacer element, the second sintered metal layer comprising sintered nanometer-sized metal particles,
wherein the spacer element comprises a dielectric material such that that first semiconductor chip is electrically isolated from the second semiconductor chip.

18. A semiconductor device comprising:
a metal carrier;
a first semiconductor chip attached to the metal carrier;
a spacer element;
a first sintered metal layer attaching the spacer element to the metal carrier;
a second semiconductor chip; and
a second sintered metal layer attaching the second semiconductor chip to the spacer element,
wherein the first semiconductor chip has a first thickness, and
wherein the second semiconductor chip has a second thickness less than the first thickness.

19. The semiconductor device of claim 18, wherein the spacer element has a third thickness such that a top of the first semiconductor chip is coplanar with a top of the second semiconductor chip.

20. A semiconductor device comprising:
a metal carrier;
a first semiconductor chip attached to the metal carrier;
a spacer element;
a first sintered metal layer attaching the spacer element to the metal carrier;
a second semiconductor chip; and
a second sintered metal layer attaching the second semiconductor chip to the spacer element,
wherein the first semiconductor chip is attached to the metal carrier via a dielectric layer, and
wherein the second semiconductor chip is electrically coupled to the metal carrier via the first sintered metal layer, the spacer element, and the second sintered metal layer.

21. A semiconductor device comprising:
a metal carrier;

a first semiconductor chip attached to the metal carrier;
a spacer element;
a first sintered metal layer attaching the spacer element to the metal carrier;
a second semiconductor chip; and
a second sintered metal layer attaching the second semiconductor chip to the spacer element,
wherein the first semiconductor chip is electrically coupled to the metal carrier via a third sintered metal layer, and wherein the spacer element comprises dielectric material such that the second semiconductor chip is electrically isolated from the metal carrier.

22. The semiconductor device of claim 1, wherein the first sintered metal layer comprise one of Ag and Cu.

23. The semiconductor device of claim 8, wherein the first sintered metal layer comprise one of Ag and Cu.

* * * * *